United States Patent [19]

Czarnocki

[11] Patent Number: 4,656,871
[45] Date of Patent: Apr. 14, 1987

[54] CAPACITOR SENSOR AND METHOD

[75] Inventor: Walter S. Czarnocki, Hoffman Estates, Ill.

[73] Assignee: Motorola, Inc., Schaumburg, Ill.

[21] Appl. No.: 755,390

[22] Filed: Jul. 16, 1985

[51] Int. Cl.⁴ .......................... G01L 9/12; G01L 19/04
[52] U.S. Cl. ...................................... 73/724; 73/708; 73/718; 330/282
[58] Field of Search ......................... 73/708, 718, 724; 328/127, 160, 1; 330/282, 86

[56] References Cited

U.S. PATENT DOCUMENTS

| | | | |
|---|---|---|---|
| 3,588,713 | 6/1971 | Yareck | 328/160 |
| 4,096,758 | 1/1978 | Moore | 73/718 |
| 4,211,971 | 7/1980 | Kabayashi et al. | 324/140 D |
| 4,250,452 | 2/1981 | Gray et al. | 328/1 |
| 4,365,204 | 12/1982 | Haque | 328/127 |
| 4,392,382 | 7/1983 | Myers | 73/708 |
| 4,441,080 | 4/1984 | Saai | 330/282 |
| 4,446,438 | 5/1984 | Chang et al. | 328/127 |
| 4,484,089 | 11/1984 | Viswanathan | 330/282 |
| 4,496,858 | 1/1985 | Smith | 328/127 |

OTHER PUBLICATIONS

"A Switched-Capacitor Digital Capacitance Bridge" by Watanabe et al., IEEE Transactions on Instrumentation and Measurement, Dec., 1984, pp. 247-251.
"Design of Nonlinear Analog Switched-Capacitor Circuits Using Building Blocks" by Mosticka et al., IEEE Transactions on Circuits and Systems; Apr., 1984, pp. 354-367.

Primary Examiner—Donald O. Woodiel
Attorney, Agent, or Firm—John H. Moore

[57] ABSTRACT

A method and apparatus are described for converting variations in a measured variable (such as pressure) to corresponding variations in an electrical output signal. The preferred method utilizes a capacitive sensor whose capacitance changes to reflect changes in the measured variable. The changes in capacitance are preferably used to vary the gain of a switched-capacitor amplifier whose signal input receives a relatively constant DC reference voltage. The amplifiers' output may be sampled and further amplified to provide an output signal which is indicative of the value of the measured variable.

5 Claims, 4 Drawing Figures

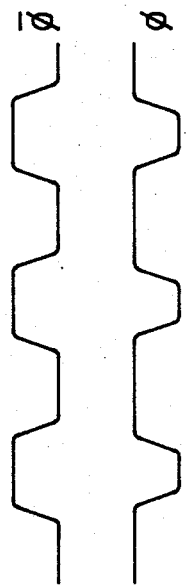
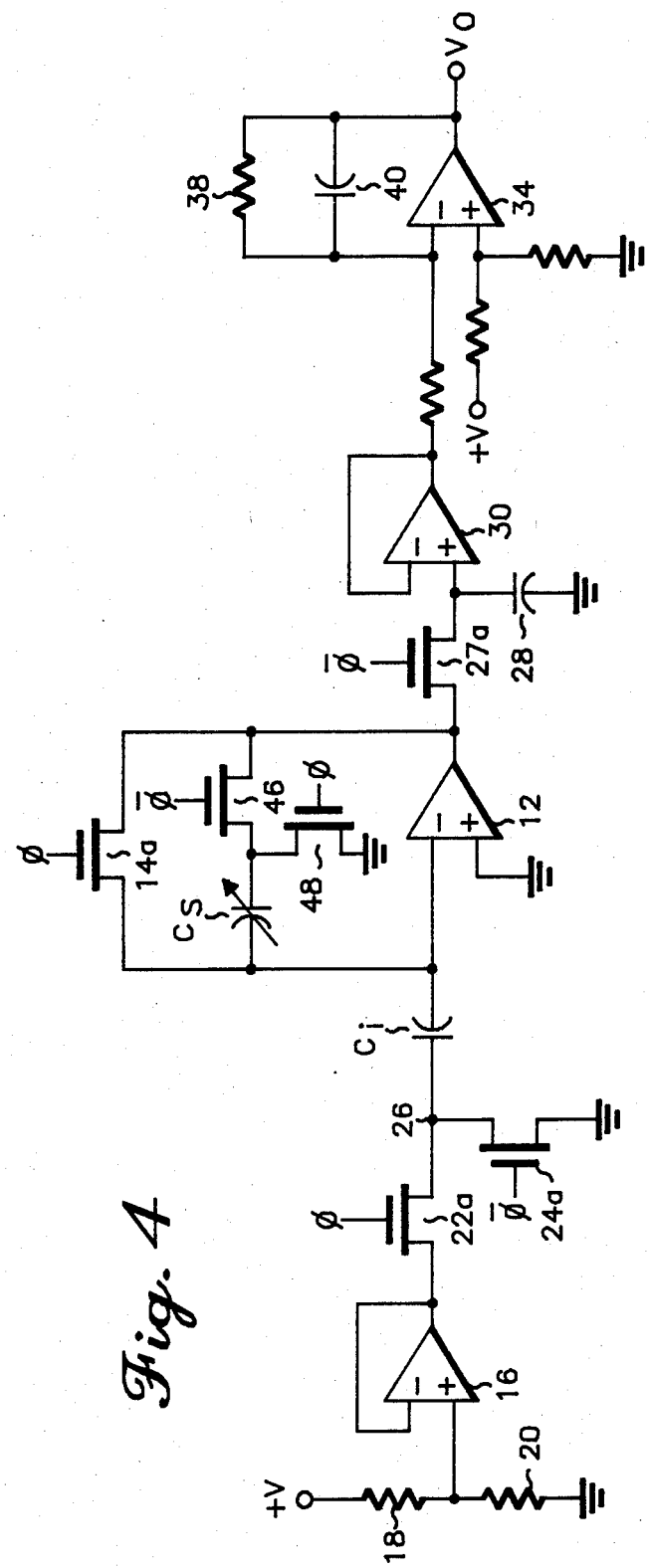
Fig. 3
Fig. 4

4,656,871

CAPACITOR SENSOR AND METHOD

FIELD OF THE INVENTION

This invention pertains to the field of sensors, particularly capacitive sensors, and to methods for converting variations in the value of a sensed variable (such as presure) to a corresponding electrical signal.

BACKGROUND OF THE INVENTION

Sensors using capacitive transducers are commonly used to convert variations in a measured pressure (or other variable) to variations in capacitance. The variations in capacitance are then processed to convert them to variations in voltage, the result being an output voltage that corresponds to the pressure (or other variable) being measured.

The processing circuitry which converts capacitance variations to voltage variations frequently uses one or more oscillators whose tuning can be varied by changes in the capacitive transducers. Another technique which performs the same function in a different way is described in U.S. Pat. No. 4,250,452.

Although the conventional techniques for converting variations in capacitance to variations in voltage perform their function in a reasonably reliable manner, certain improvement are desirable. For example, the conventional techniques use processing circuitry which is fairly complex and which includes a relatively large number of components. Reducing the number of components and circuit complexity would not only reduce cost, but permit easier and more complete compensation for temperature changes.

Another improvement which is desireable and significant is to reduce the sensitivity of the processing circuits to stray capacitance. As is described in more detail later herein, the effects of stray capacitance can mask desired variations in the capacitance of the capacitive tranducers. Also, it is desireable to eliminate the sensitivity of the processing circuitry to amplitude and frequency variations in the oscillator signals and/or switching signals which are conventionally used with this type of processing circuit.

OBJECTS OF THE INVENTION

It is a general object of the invention to provide an improved method and apparatus for converting variations in a measured variable to variations in an electrical output signal.

It is another object of the invention to provide a method and apparatus for processing the variations in a sensor capacitance so as to eliminate or at least minimize the effects of stray capacitance, and to avoid the previously mentioned drawbacks of conventional processing circuitry.

SUMMARY OF THE INVENTION

Stated broadly, this invention is directed to a method and apparatus for converting variations in a measured variable (such as pressure) to corresponding variations in an electrical output signal. The preferred method uses a capacitive sensor whose capacitance changes to reflect changes in the value of the variable being measured. The changes in capacitance are preferably used to vary the gain of a switched-capacitor amplifier whose signal input receives a relatively constant DC reference voltage. Thus, the reference voltage becomes multiplied by the gain of the amplifier. The multiplied reference voltage may be sampled (as with a sample and hold circuit) and further amplified to provide an output signal which is indicative of the value of the measured variable.

BRIEF DESCRIPTION OF THE FIGURES

FIG. 3 depicts the clock signal waveforms developed by the generator shown in FIG. 2; and FIG. 4 shows another embodiment of a sensing circuit according to the invention.

DESCRIPTION OF THE PREFERRED EMBODIMENT

Before describing the disclosed embodiments in detail, a few preliminary comments will be made to illustrate the design philosphy used with this invention. In a typical situation in which gas pressure is to be measured, the gas pressure is sensed by a transducer and the transducer's output signal is then processed by electronic circuitry to develop a voltage V(p) which is a function of pressure. Then V(p) is amplified by a gain A to develop an output signal $V_o$ as described by equation (1):

$$V_o = A \times V(p) \tag{1}$$

To develop V(p) usually requires a fairly complex circuit and entails the problems discussed previously. For this invention, a different approach is used. Instead of developing a voltage which is a function of pressure, a substantially constant reference voltage $V_R$ is developed and amplified by an amplifier whose gain A(p) is not constant, but is a function of pressure. The resultant output voltage $V_o$ is as described by equation (2):

$$V_o = V_R \times A(p) \tag{2}$$

Comparing equation (1) with equation (2) reveals that $V_o$ is the same in each case, but that it is obtained in a different way. Holding $V_R$ constant and varying the gain A allows one to take advantage of known circuit techniques to achieve a less complex circuit which is substantially less sensitive to the effects of stray capacitive and which is less temperature dependent.

One of the circuit techniques which is used in the illustrated embodiments involves the use of switched capacitors as described in an article entitled "Design of Nonlinear Analog Switched-Capacitor Circuits Using Building. Blocks" by Hosticka et al, IEEE Transactions on Circuits and Systems, April 1984. Those techniques are modified to provide a variable gain amplifier in combination with other components to provide an improved circuit for converting measured pressure to an electrical output signal, as will now be discussed in more detail.

Figure 1:
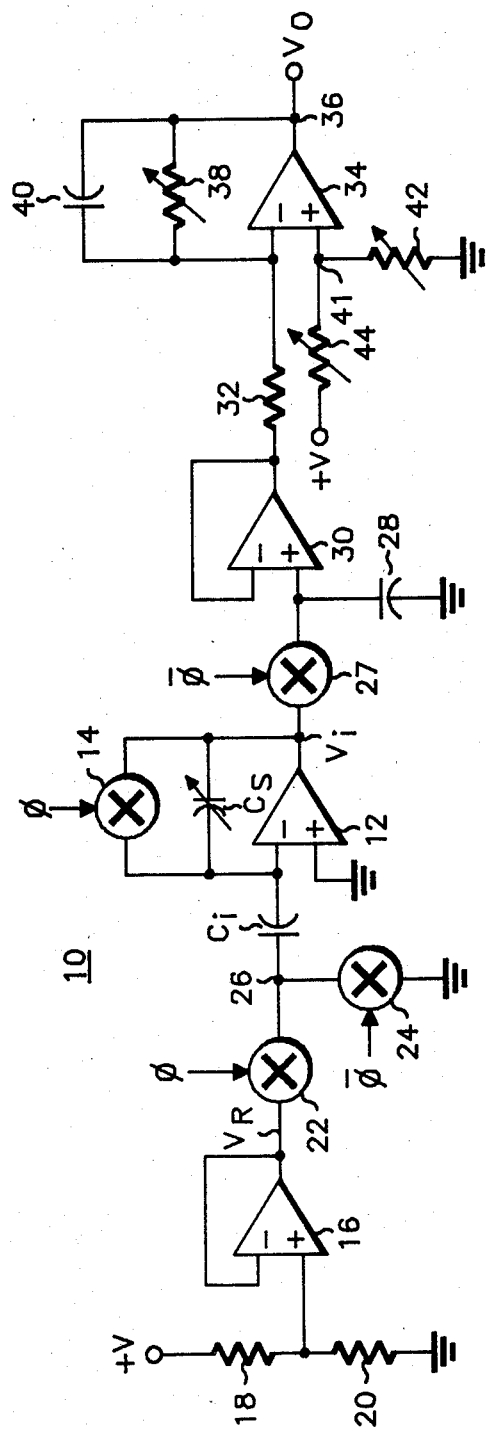
FIG. 1 is a schematic circuit diagram of a sensing circuit according to the invention.

Referring to FIG. 1, there is shown a capacitive sensor circuit 10 for converting a measured input variable to a electrical output signal (indicated as $V_o$). The input variable to be measured may be pressure or any other variable which can be converted to a change in capacitance. Because the illustrated circuitry has been particularly adapted to act as a gas pressure sensor, it will be assumed that gas pressure is the variable being measured.

The first step in converting a measured pressure to an output signal is to convert changes in pressure to changes in capacitance. Toward this end, the capacitance $C_s$ represents a variable capacitor which forms part of a conventional pressure sensor device which will not be described in detail. Suffice it to say that changes in the measured pressure result in changes in the value of the capacitance $C_s$.

As shown, the capacitance $C_s$ is coupled in a feedback path around an otherwise conventional amplifier 12. Coupled in parallel with the capacitor $C_s$ is a transmission gate or switch 14. The switch 14 is opened and closed by a clock signal of phase $\phi$ such that the combination of the amplifier 12, the capacitance $C_s$ and the switch 14 operates as a part of a switched capacitor amplifier.

As indicated in FIG. 1, the amplifier 12 has a non-inverting input which is grounded and an inverting input which is coupled to the capacitance $C_s$, to the switch 14, and to an input capacitor $C_i$. The significance of the capacitor $C_i$ is discussed later.

Another step in the present method of converting the measured pressure to an electrical output signal includes providing a DC reference signal which has a substantially constant value. Such a reference signal is provided in FIG. 1 by a conventional operational amplifier 16. The inverting input of this amplifier is coupled to its output, and the non-inverting input is coupled to the junction between a pair of biasing resistors 18 and 20. With this arrangement, a substantially constant DC voltage $V_R$ is developed at the output of the amplifier 16.

Coupled in series between the output of the amplifier 16 and the capacitor $C_i$ is another switch 22. A further switch 24 is coupled between the junction of switch 22 and capacitor $C_i$ (node 26) and ground. As indicated, the switch 24 responds to a phase $\phi$ of a clock signal and the switch 22 responds to the opposite phase $\overline{\phi}$. Thus, when $\phi$ is high, the switch 22 closes to connect the output of the amplifier 16 to node 26, and the switch 24 remains in an open state. When $\phi$ goes high, the switch 24 grounds the node 26, and the switch 22 opens to decouple the amplifier 16 from the node 26.

Figure 2:
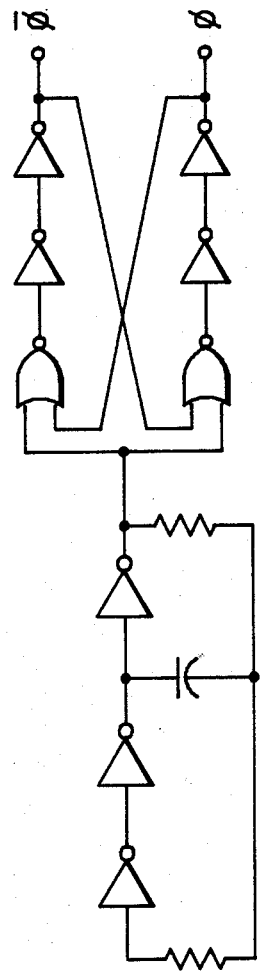
FIG. 2 is a schematic diagram of a clock generator for developing clock signals to be applied to the circuitry of FIG. 1.

The clock signals $\phi$ and $\overline{\phi}$ may be developed by the clock generator shown in FIG. 2 or by any suitable clock generator which generates a two-phase nonoverlapping clock. FIG. 3 illustrates the clock signals $\phi$ and $\overline{\phi}$ developed by the generator shown in FIG. 2.

Referring now to the output of the amplifier 12, it is coupled to another switch 27 which is responsive to $\overline{\phi}$. The opposite side of the switch 27 is coupled to ground via a capacitor 28 and to the non-inverting input of a buffer amplifier 30. The combination of the switch 27, the capacitor 28 and the amplifier 30 operates as a sample and hold circuit.

The output of the sample and hold circuit is coupled via a resistor 32 to the inverting input of another amplifier 34. The output (node 36) of this amplifier is coupled to its inverting input by a variable resistor 38 (which adjusts the gain of amplifier 34) in parallel with a feedback capacitor 40. The non-inverting input of the amplifier 34 is coupled to the junction (node 41) between a pair of biasing resistors 42 and 44 whose values may be varied to change the DC offset voltage developed at the output node 36.

Referring again to the capacitor $C_i$, it will be noted that, when $\overline{\phi}$ is high and the switch 24 is closed, the gain of the switched-capacitor amplifier is proportional to $C_s/C_i$. Thus, if the capacitor $C_i$ becomes charged by $V_R$ (the DC reference voltage), then the output of the switched-capacitor amplifier corresponds to $V_R \times C_s/c_i$. As the measured pressured varies, the value of $C_s$ will also vary, thereby changing the gain of the switched-capacitor amplifier. By varying the gain of this amplifier, an output signal is developed to indicate the value of the pressure being measured.

The operation of the illustrated pressure sensor will now be described.

Assuming that the clock signal $\phi$ is high, the reference voltage $V_R$ will charge the capacitor $C_i$ through the switch 22. At this time, the output of the amplifier 12 is essentially at ground potential because the switch 14 shorts the amplifier's output back to its inverting input which is a virtual ground.

When $\overline{\phi}$ goes high, the node 26 becomes grounded via switch 24 and the switched capacitor amplifier attains a gain corresponding to $C_s/C_i$. Consequently, the output of the switched capacitor amplifier, indicated as $V_i$, has a value corresponding to $C_s/C_i \times V_R$. Consequently, as the measured pressure changes, the value of $C_s$ changes, and this results in a change in the gain of the switched capacitor amlifier and a corresponding change in the value of the voltage $V_i$.

Since $\overline{\phi}$ is high, $V_i$ is sampled by coupling it through the switch 27 to the capacitor 28. The resulting charge on the capacitor 28 will be held for a complete clock cycle until $\phi$ goes high again to permit the voltage $V_i$ (which may have changed) to be sampled again.

The sampled signal which appears at the output of buffer 30 is amplified by the amplifier 34 to develop an output signal $V_o$ at the node 36 as expressed by equation (3) below:

$$V_o = -KV_R \frac{C_i}{C_s} + (1 + K)V_{os} \quad (3)$$

where K is a factor which depends on system gain and $V_{os}$ is an adjustable DC voltage at the node 41 which provides a selectable DC output voltage or offset at the node 36. Because $C_s$ varies with measured pressure, $V_o$ will vary accordingly.

One of the major advantages of the technique is that stray capacitances are largely ignored. This is because the inverting input of the amplifier 12 is a virtual ground. Consequently, stray capacitance at that point will not measurably affect operation. Also, the illustrated embodiment is relatively simple to construct and is not particularly sensitive to variations in ambient temperature.

In a test of the illustrated embodiment, with a $V_R$ of 1.73 volts and a clock frequency of about 24.5 KHz, $C_s$ varied in response to pressure changes from a value of 32.3 pf to 40.6 pf, resulting in a change of about 16.5% in $V_i$ (the output of the switched capacitor amplifier). This change in $V_i$ is about 25% greater than would be expected under similar conditions using conventional sensor processing circuitry.

Referring now to FIG. 4, another embodiment is shown which is similar to the embodiment shown in FIG. 1 except that the switches are shown as N-Channel field effect transistors, and two additional switches have been included. The remaining components have the same reference numerals as their counterparts in FIG. 1.

More particularly, the switch 14 has been replaced by a transistor 14a, the switch 22 has been replaced by a transistor 22a, the switch 24 has been replaced by a transistor 24a, and the switch 27 has been replaced by the transistor 27a. In addition, transistors 46 and 48, responsive to clock signals $\overline{\phi}$ and $\phi$, respectively, have been coupled in circuit with the sensor capacitance $C_s$. As shown, the transistor 46 is coupled in series with $C_s$, and their junction is coupled to ground through the transistor 48. With this arrangement, improved cancellation of the input offset voltage of amplifier 12 is provided. In other respects, the operation of the FIG. 4 embodiment is the same as the operation of the FIG. 1 embodiment.

While the disclosed embodiments are preferred, many modifications will be obvious to those skilled in the art, particularly in circumstances where the invention is used in a different application. In most of those applications, the ability to use a stable reference voltage in combination with a variable gain amplifier as described herein will be most advantageous in comparison to the complexity and difficulties of prior processing circuitry. Simplicity, ease of temperature compensation, and freedom from the effects of stray capacitance are particularly significant advantages.

It is intended that the various modifications which are obvious to those skilled in the art in light of the disclosure will be considered as within the spirit and scope of the invention as defined by the appended claims.

What is claimed is:

1. A method of converting a measured input variable to an electrical output signal, comprising:
   (a) converting changes in the variable to changes in capacitance;
   (b) providing a DC reference signal having a substantially constant value;
   (c) multiplying the DC reference signal by a variable gain which changes as a function of changes in said capacitance, including providing an amplifier connected to form part of a switched-capacitor amplifier with said capacitance, coupling the capacitance in a feedback path around the amplifier so as to vary the gain of the amplifier in accordance with variations in the capacitance, and applying the reference signal to the amplifier's input; and
   (d) outputting the multiplied reference signal for use as an indicator of the value of the input variable.

2. A method as set forth in claim wherein step (d) includes sampling the multiplied DC reference signal.

3. A method as set forth in claim 2 wherein step (d) further includes amplifying the sampled signal.

4. A method as set forth in claim 1 wherein the measured input variable is pressure, and wherein step (a) includes converting changes in the meausred pressure to changes in capacitance.

5. A capacitive pressure sensor, comprising:
   a sensor capacitance for sensing pressure and for varying the value of capacitance in response to changes in the value of the measured pressure;
   a switched-capacitor amplifier having an input and an output;
   means coupling the sensor capacitance in a feedback configuration between the amplifier's input and output such that the amplifier's gain changes in response to changes in the value of the sensor capacitance;
   means for developing a reference voltage having a substantially constant value;
   means for coupling the reference voltage to the input of the amplifier such that the amplifier's output includes a signal whose value corresponds to the value of the reference voltage times the gain of the amplifier; and
   means receiving the signal at the output of the amplifier to develop a further signal whose value is indicative of the sensed pressure.

* * * * *